US006650149B1

(12) United States Patent
Wong (10) Patent No.: US 6,650,149 B1
(45) Date of Patent: Nov. 18, 2003

(54) LATCHED ACTIVE FAIL-SAFE CIRCUIT FOR PROTECTING A DIFFERENTIAL RECEIVER

(75) Inventor: Anthony Yap Wong, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/064,776

(22) Filed: Aug. 15, 2002

(51) Int. Cl.[7] .................................................. H03K 5/22
(52) U.S. Cl. .......................................... 327/65; 327/14
(58) Field of Search ................................. 327/309, 306, 327/333, 65, 14, 50; 326/14, 13, 86

(56) References Cited

U.S. PATENT DOCUMENTS

| 4,237,387 A | 12/1980 | Devendorf et al. ......... 327/223 |
| 4,627,085 A | 12/1986 | Yuen ........................... 377/81 |
| 4,697,099 A | 9/1987 | Bonaccio ..................... 327/66 |
| 5,065,047 A | 11/1991 | Igari et al. ................... 326/14 |
| 5,087,834 A | 2/1992 | Tsay ............................. 326/33 |
| 5,488,306 A | 1/1996 | Bonaccio ..................... 324/539 |
| 5,729,208 A | 3/1998 | Ogiwara ....................... 340/635 |
| 6,130,795 A | 10/2000 | Freitas et al. ................. 360/67 |
| 6,184,700 B1 | 2/2001 | Morris ......................... 326/14 |
| 6,288,577 B1 | 9/2001 | Wong ........................... 327/65 |
| 6,320,406 B1 | 11/2001 | Morgan et al. ............... 326/14 |
| 6,486,695 B1 * | 11/2002 | Nakagawara ................. 326/14 |

* cited by examiner

Primary Examiner—Dinh T. Le
(74) Attorney, Agent, or Firm—Stuart T. Auvinen (57) ABSTRACT

A fail-safe circuit for a differential receiver can tolerate noise. A latch is enabled when both differential inputs V+, V− rise above a reference voltage that is close to Vcc. The latch, once enabled, is set by an offset amplifier, signaling the fail-safe condition. The offset amplifier sets the latch when V+ is above or equal to V−. The differential amplifier has a small offset voltage to allow the latch to remain set when V+ and V− are equal in voltage. An output from a differential amplifier receiving V+ and V− can be blocked by a gate when the fail-safe condition is latched. Pullup resistors pull V+, V− to Vcc when an open failure occurs. The latch remains set when common-mode noise occurs on V+, V−, preventing noise from prematurely disabling the fail-safe condition. Such noise coupled into a broken cable is usually common-mode.

19 Claims, 6 Drawing Sheets

LATCHED ACTIVE FAIL-SAFE CIRCUIT FOR PROTECTING A DIFFERENTIAL RECEIVER

BACKGROUND OF INVENTION

This invention relates to differential receivers, and more particularly to latched fail-safe circuits for low-voltage differential signaling (LVDS) receivers.

Networking equipment and other electronic systems often transmit signals over cables. Although the cables may be only a few meters in length, a transmission-line effect degrades data quality and transmission rate. Large signal swings also increases electro-magnetic interference (EMI) and system noise. To send signals over these cables, special drivers and receivers have been developed.

The problems of the transmission-line effect have been mitigated with reduced voltage swings. Also, a pair of physical signals driven to opposite states are together used to transmit a single logical signal. Such differential signaling has been used with Emitter-coupled logic (ECL) for many years, and more recently in low-voltage differential signaling (LVDS) drivers and receivers.

LVDS drivers have a pair of outputs that are driven to opposite states. The two outputs are sent separately down the cable to the receiver, and at the far (receiver) end of the cable the lines are connected together by a terminating resistor. A current loop exists from one transmitter output, down the cable, through the terminating resistor, back up the cable to the other line's transmitter output. A voltage drop occurs across the terminating resistor that is sensed by the receiver. However, the voltage difference across the terminating resistor between the two signals is small, perhaps only a few hundred millivolts. Sensitive receivers are needed to detect such a small voltage difference between the two signal lines.

In real-life systems, cables can become disconnected, such as by a network technician when networks are modified, or when a cable fails. The transmitter can also fail or be in a high-impedance output state. At these times, neither output line is driven. The voltage across the terminating resistor drops to near zero. Noise can be coupled into the cable from various sources, and this noise can be picked up by the receiver's differential inputs. The output of the receiver can oscillate or enter an uncertain logic state, even though the differential receiver has common mode rejection. False triggering of receiver logic can occur.

Figure 1:
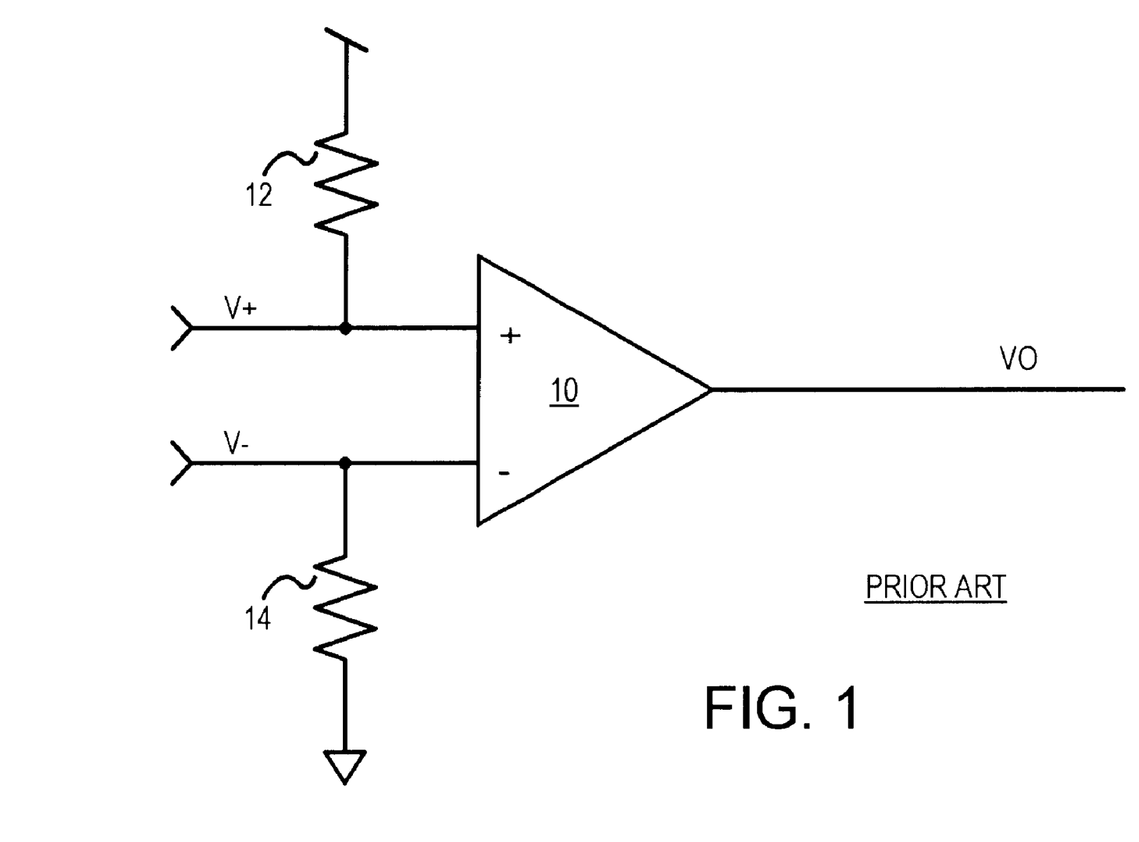
FIG. 1 shows a prior-art fail-safe circuit that connects the differential inputs to power and ground.

To prevent such problems, fail-safe circuits have been employed. A simply fail-safe circuit uses resistors to connect the differential lines to power and ground. FIG. 1 shows a prior-art fail-safe circuit that connects the differential inputs to power and ground. Differential amplifier 10 receives a differential pair of input voltages V+, V−, and amplifies the voltage difference between V+ and V− to generate the output VO. Output VO typically is a digital signal driven fully to power and ground.

Sometimes differential inputs V+, V− are not driven by the transmitter, such as when a cable to the transmitter is disconnected, shorted together, or broken, or the transmitter is in a high-impedance state or is non-operational. When not being driven, signals V+, V− can float to indeterminate voltages, and noise can be coupled in. To prevent output VO from being in an indeterminate state, resistors 12, 14 are added.

Pullup resistor 12 connects differential input V+ to power, while pull-down resistor 14 connects differential input V− to ground. Resistors 12, 14 have a high resistance, such as hundreds of K-Ohms or more, to minimize any voltage shift to V+, V− during normal operation when driven by the differential transmitter. However, when lines V+, V− are floating, the small current from pullup resistor 12 causes line V+ to rise to the power-supply voltage Vcc, while pull-down resistor 14 produces a small current to pull line V− down to ground. When V+, V− are floating, resistors 12, 14 ensure that the inputs of differential amplifier 10 are in the 1, 0 logical state, so that output VO is driven high by differential amplifier 10.

Resistors 12, 14 have some unwanted disadvantages. When the cable fails by shorting together the two signals V+, V−, the fail-safe circuit does not function properly, since V+ and V− are shorted to the same voltage, and the small currents from resistors 12, 14 are not able to overcome the larger shorting current. Also, when a terminating resistor (not shown) is coupled between signals V+, V−, this resistor conducts so much more current than resistors 12, 14, that V+, V− have the same voltage despite resistors 12, 14. Resistors 12, 14 have resistances of many K-Ohms, while the terminating resistor has a resistance of only 100 Ohms. Thus using pullup and pulldown resistors are not effective with LVDS receivers, which use 100-Ohm terminating resistors.

Figure 2:
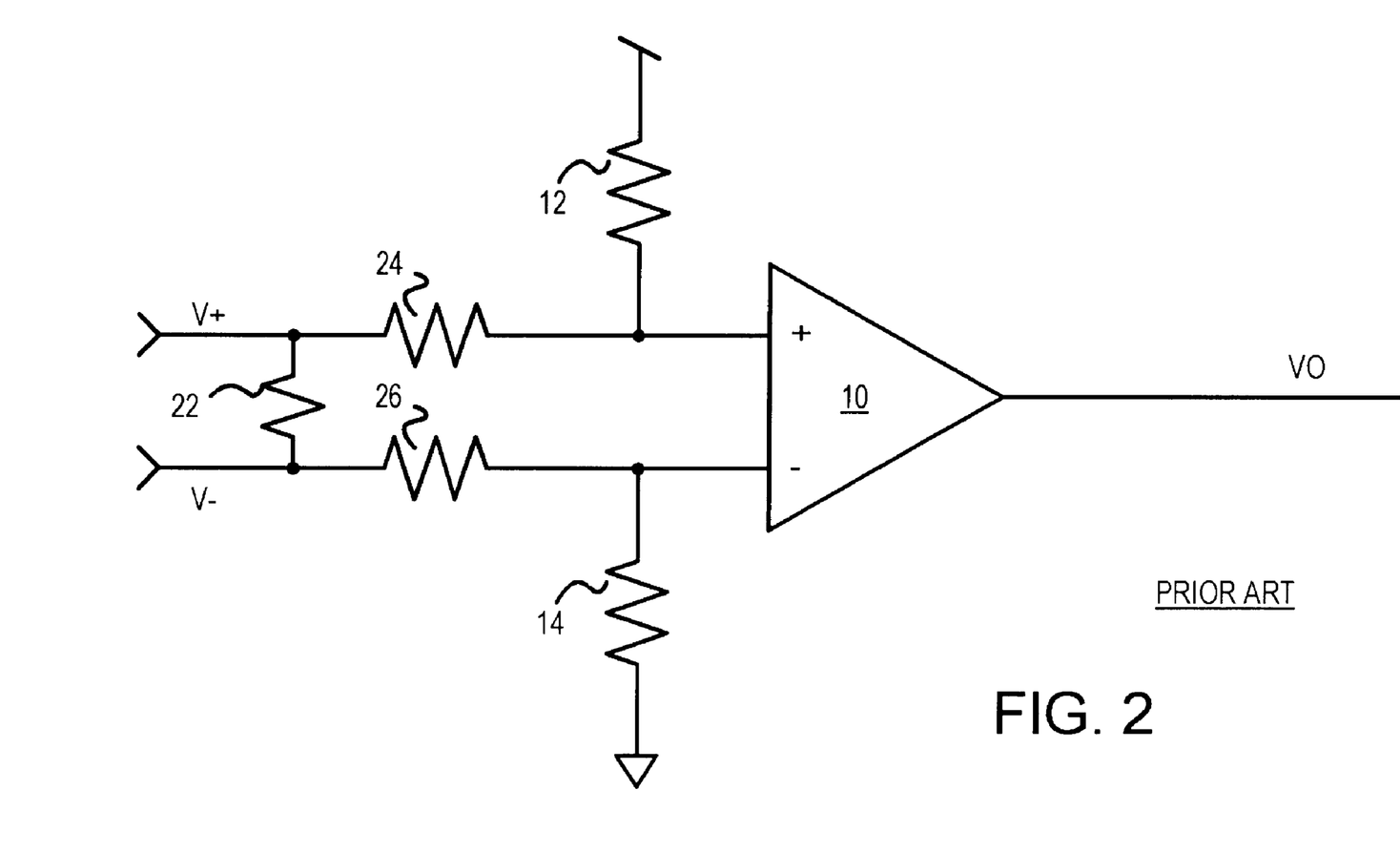
FIG. 2 shows another prior-art fail-safe circuit.

FIG. 2 shows another prior-art fail-safe circuit. When a 100-Ohm terminating resistor 22 connects V+ to V−, the small current from resistors 12, 14 is insufficient to create enough voltage drop through terminating resistor 22. Series resistor 24 is added between V+ and the non-inverting input of differential amplifier 10, while series resistor 26 is added between V− and the inverting input of differential amplifier 10. The additional voltage drops through series resistors 24, 26 creates an additional voltage difference on the inputs to differential amplifier 10 when resistors 12, 14 supply the small current. This additional voltage difference on the input is enough to drive the VO output of differential amplifier 10 into a high state when a short occurs between V+ and V−.

Figure 3:
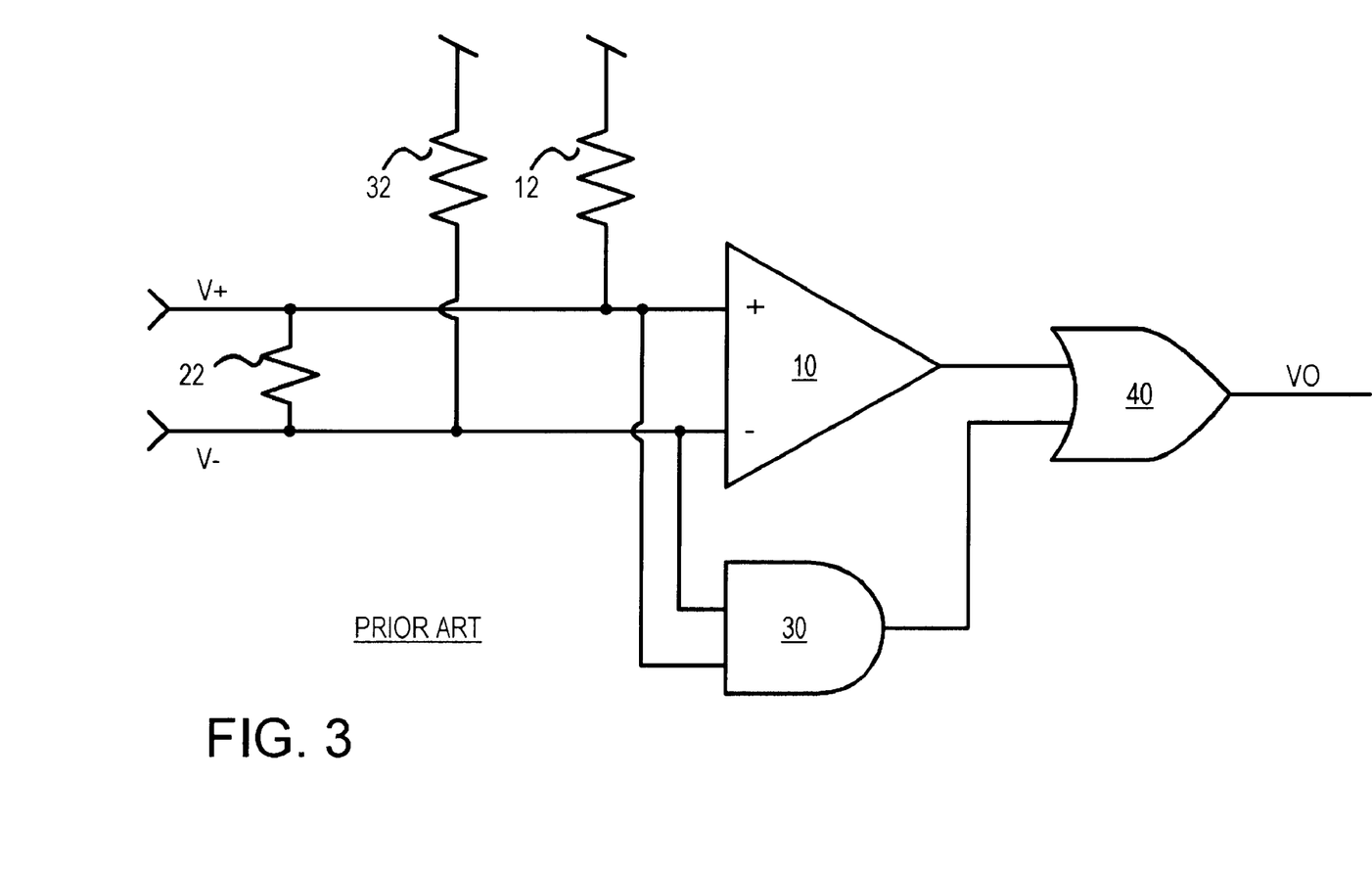
FIG. 3 shows a prior-art fail-safe circuit using an error-detection logic gate.

Unfortunately, the addition of series resistors 24, 26 increases the R-C delay of the cable driving the inputs of differential amplifier 10. This additional delay can be significant and is undesirable. Also, the resistance values of series resistors 24, 26 may introduce an unwanted offset voltage to the inputs of amplifier 10. s FIG. 3 shows a prior-art fail-safe circuit using an error-detection logic gate. When an open or a short occur on lines V+, V−, pullup resistor 12 pulls signal V+ high, while pullup resistor 32 pulls signal V− high. Since both lines V+, V− are pulled high by resistors 12, 32, no current flows through terminating resistor 22.

AND gate 30 is coupled to the inverting and non-inverting inputs of differential amplifier 10. When an open or short occurs and resistors 12, 32 pull both V+ and V− high, AND gate 30 detects the high-high condition on its inputs and outputs a high to OR gate 40. OR gate 40 drives its VO output high, since one of its inputs is high. The state of the input from differential amplifier 10 does not matter. Thus any indeterminate state of the output from differential amplifier 10 is masked by OR gate 40.

A problem can occur during normal operation of differential amplifier 10. When inputs V+, V− have a high common-mode voltage, AND gate 30 can read the high voltages on V+ and V− as highs, even though enough of a voltage difference exists between V+ and V− to properly operate differential amplifier 10. For example, when a 3-volt power supply is used, AND gate 30 may detect all input voltages above 2.3 volts as a high voltage. Signals V+, V− may swing between 2.5 and 2.9 volts, having a high common-mode voltage of 2.7 volts. When V+ is 2.5 volts and V− is 2.9 volts, differential amplifier 10 detects and outputs a low during normal operation. However, AND gate 30 sees both inputs V+ and V− above its logic threshold of 2.3 volts, and outputs a high. OR gate 40 then outputs a high despite the low from differential amplifier 10. Thus the correct outputs signal from differential amplifier 10 is blocked by the false triggering of the fail-safe circuit. Note that this example used a raised threshold of 2.3 volts, compared with the normal logic threshold of Vcc/2 or 1.5 volts. The problem is much worse for a normal-threshold AND gate.

Figure 4:
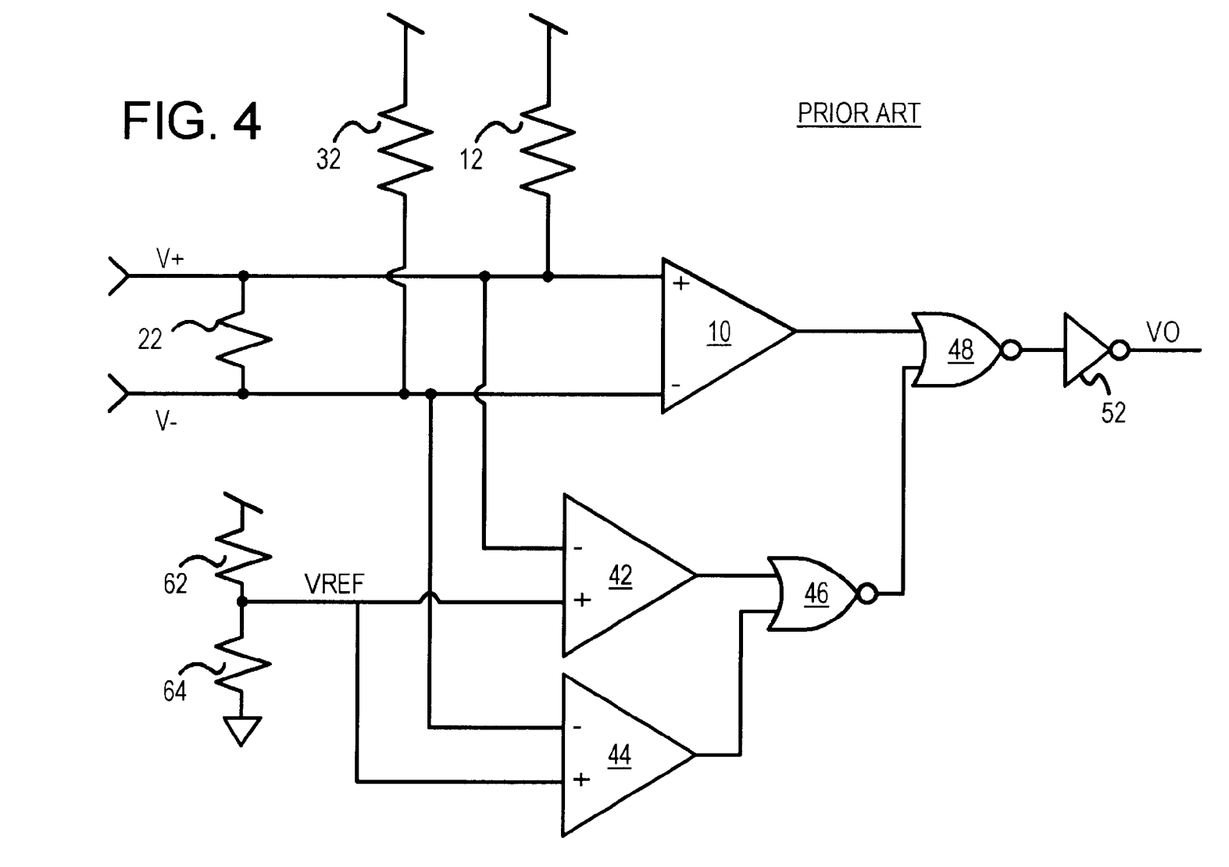
FIG. 4 is a prior-art differential receiver with a fail-safe circuit with a high common-mode range.

FIG. 4 is a prior-art differential receiver with a fail-safe circuit with a very high common-mode range. See U.S. Pat. No. 6,288,577 to Wong. A voltage across terminating resistor 22 is detected by differential amplifier 10. In normal operation, the lower input to NOR gate 48 is low, so that the output from differential amplifier 10 is passed through NOR gate 48 and inverted by inverter 52 to generate output VO.

The differential signals V+, V− are also applied to the inverting inputs of comparators 42, 44, respectively. The non-inverting inputs of comparators 42, 44 are driven by reference voltage VREF. Resistors 62, 64 form a voltage divider that generate VREF near Vcc, such as at 2.91 volts for a 3-volt Vcc.

One of V+, V− is low during normal operation. For example, when V+ is low, comparator 42 outputs a high, since VREF is above V+. When V− is low, comparator 44 outputs a high, since VREF is above V−. However, when a cable or transmitter interruption or failure occurs, such as an open on V+, V−, pullup resistors 12, 32 are able to pull signals V+ and V− up to Vcc, since no other currents are conducted from lines V+, V−. When both of signals V+, V− rise above VREF, comparators 42, 44 both output lows to the inputs of NOR gate 46. NOR gate 46 then outputs a high to the lower input of NOR gate 48, causing NOR gate 48 to ignore its upper input from differential amplifier 10 and output a low to inverter 52, which drives VO high. This is the fail-safe condition, when an indeterminate output from differential amplifier 10 is blocked.

Although a very wide common-mode input range is tolerated, glitches and other transitory signals can disrupt operation and cause false triggering of the fail-safe condition. Inputs V+, V− are often tied to long lines which can act as antennas, picking up stray noise signals. What is desired is a noise-tolerant fail-safe circuit for a differential receiver.

DETAILED DESCRIPTION

The present invention relates to an improvement in fail-safe circuits for differential receivers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 5:
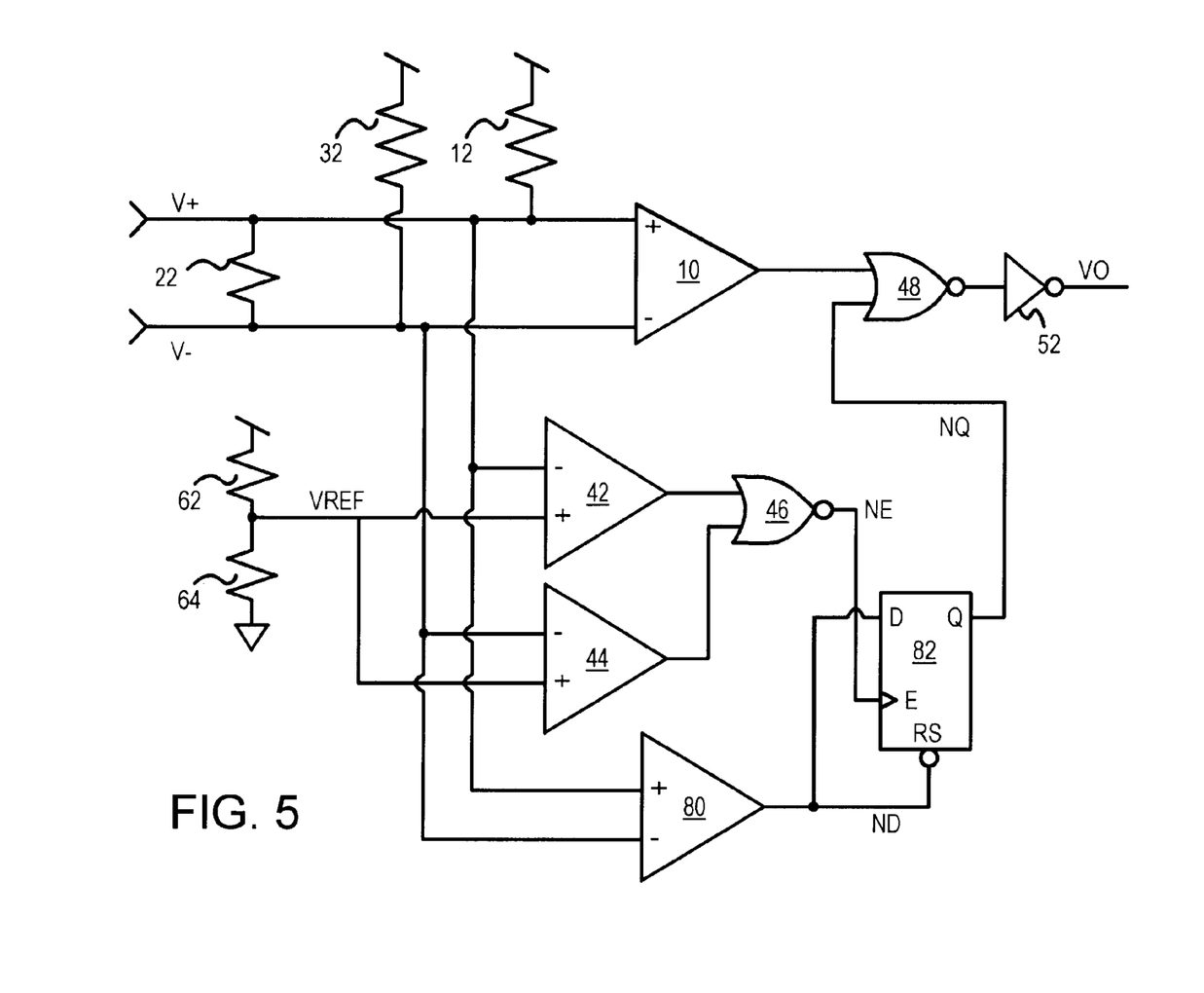
FIG. 5 is a differential receiver with a latching fail-safe circuit.

FIG. 5 is a differential receiver with a latching fail-safe circuit. A transmitter drives a current between V+ and V−, which generates a voltage across load or terminating resistor 22. This voltage is detected by differential amplifier 10, which receives signals V+ and V− on its non-inverting and inverting inputs.

In normal operation, the lower input to NOR gate 48 is low, so that the output from differential amplifier 10 is passed through NOR gate 48 and inverted by inverter 52 to generate output VO. Output VO is a digital signal such as a Transistor-Transistor-Level (TTL) signal that may be driven full-rail (to power and ground).

The differential signals V+, V− are applied to the inverting inputs of comparators 42, 44, respectively. The non-inverting inputs of comparators 42, 44 are driven by reference voltage VREF, which is very close to the power-supply voltage Vcc. Resistors 62, 64 form a voltage divider that generate VREF. The resistance of pull-up resistor 62 is much less than the resistance of pull-down resistor 64, so that VREF is 97% of Vcc, or 0.97*Vcc in this example. For a 3.0-volt Vcc, VREF is 2.91 volts. Of course, resistors 62, 64 can be adjusted to obtain other values of VREF near Vcc, but the best results are obtained when VREF is as close as possible to Vcc.

During normal operation, pullup resistors 12, 32 produce very small currents, since they have large resistance values such as 500 k-ohm. The current through terminating resistor 22 is much greater than these currents, so their effect is negligible.

One of V+, V− is low during normal operation. For example, when V+ is low, comparator 42 outputs a high, since VREF is above V+. When V− is low, comparator 44 outputs a high, since VREF is above V−. Although one of V+, V− may be driven low, the other is driven high during normal operation. One or both of comparators 42, 44 outputs a high to NOR gate 46 during normal operation, which outputs a low on signal NE to the clock input of latch 82.

Offset amplifier 80 is a differential amplifier or op amp that compares inputs V+ and V−. However, offset amplifier 80 has an offset of about +50 mV. Input V− must be at least 50 mV above input V+ for offset amplifier 80 to output a low. When V+ and V− have equal voltages, offset amplifier 80 outputs a high, since the internal input voltage for V+ is 50 mV above the internal V− input voltage. A high is normally output on line ND by offset amplifier 80 when V+ is above V−.

During normal operation, V+ and V− are toggling, with V− sometimes more than 50 mV above V+. Then offset amplifier 80 outputs a low on signal ND, causing latch 82 to be reset, since signal ND is applied to the reset input of latch 82. When latch 82 is reset, its outputs a low to signal NQ. Since signal NQ is applied to the lower input of NOR gate 48, NOR gate 48 allows the output from differential amplifier 10 to pass through to output VO.

Also during normal operation, inputs V+ and V− are each below VREF, since VREF is close to Vcc, such as 0.95*Vcc, and V+ and V− typically switch near Vcc/2. Comparators 42, 44 each output a high to NOR gate 46, which drives a low to enable signal NE. Even if one of V+ or V− should go above VREF, the other is below VREF so at least one of comparators 42, 44 is outputting a high to NOR gate 46, keeping enable signal NE low. The low enable signal NE is applied to the clock or enable input of latch 82, keeping latch 82 from passing the D input to the Q output. Instead, the last state of latch 82 is retained, which is usually a low from the last reset.

Thus during normal operation latch 82 outputs a low to NOR gate 48. Latch 82 remains in the low state because enable signal NE remains low and because latch 82 is reset by signal ND each time V− goes high and V+ goes low.

When a cable or transmitter interruption or failure occurs, such as an open on V+, V−, pullup resistors 12, 32 are able to pull signals V+ and V− up to Vcc, since no other currents are conducted from lines V+, V−. When both of signals V+, V− rise above VREF, comparators 42, 44 both output lows to the inputs of NOR gate 46. NOR gate 46 then outputs a high to enable signal NE, the clock input of latch 82. Latch 82 then becomes transparent, passing its D input, signal ND, to its Q output, signal NQ.

Resistor 22 between V+ and V− ensures that both V+ and V− are pulled high when an open or a high-impedance drive occurs. When V+ and V− are at the same voltage, offset amplifier 80 outputs a high on signal ND due to the +50 mV offset. The high ND disables the reset of latch 82, and provides a high signal at the D input. When clock enable signal NE is also high, the high D signal is passed to the Q output and signal NQ is drive high.

The high on signal NQ is applied to the lower input of NOR gate 48, causing NOR gate 48 to ignore its upper input from differential amplifier 10 and output a low to inverter 52, which drives VO high. This is the fail-safe condition, when an indeterminate output from differential amplifier 10 is blocked.

Figure 6:
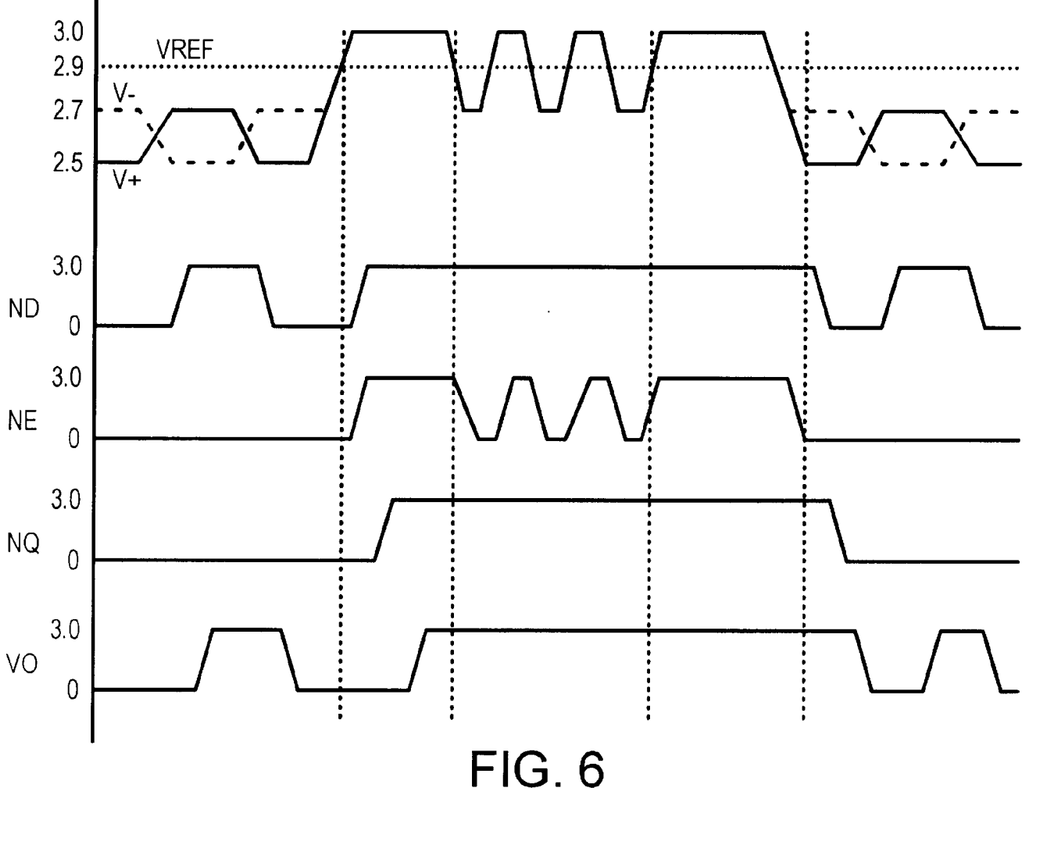
FIG. 6 is a waveform highlighting operation of the noise-tolerant latching fail-safe circuit of FIG. 5.

FIG. 6 is a waveform highlighting operation of the noise-tolerant latching fail-safe circuit of FIG. 5. Inputs V+, V− initially toggle between 2.5 and 2.7 volts in normal operation. Then both inputs V+, V− are pulled high to Vcc due to a broken cable or a driver in a high impedance state. Common-mode noise is simulated by pulling both V+ and V− low to below VREF for period of time. Finally normal operation resumes as both V+, V− fall below VREF and resume toggling between 2.5 and 2.7 volts.

Signal ND goes low when V− is more than the offset (50 mV) above V+. Otherwise signal ND is high, such as when V+ is above V− during normal operation, and during the simulated failure when V+ and V− are at the same voltage. Note that ND remains high when V+ equal V−, even when the V+, V− inputs fall below VREF due to simulated common-node noise during a cable break or high-impedance driver.

Signal NE is normally low, since at least one of the inputs is below VREF during normal operation. Indeed, usually both inputs V+, V− are below VREF. However, when the cable fail occurs, both inputs V+, V− are pulled to Vcc by the terminating and pull-up resistors. When both inputs V+, V− are above VREF, enable signal NE goes high, enabling the latch to signal fail-safe.

When one or both of inputs V+, V− go low, such as during the simulated common-mode noise, enable signal NE also goes low. However, the latch output, signal NQ, remains high during this common-mode noise as shown in the middle of the waveforms. This is because signal ND remains high and when disabled by signal NE low the latch retains its last state. Signal ND remained high because of the offset in offset amplifier 80 and the voltage of V+ equaled the voltage of V− during the common-mode noise.

Signal NQ is not reset until both signal ND and NE are low at the same time. This occurs when both V+ and V− fall below VREF, and V+ is lower than V− by more than the offset. Once latch 82 is reset, it cannot be set until both V+ and V− are simultaneously above VREF.

Since VREF is 2.91 volts in this example, both V+ and V− must rise above 2.91 volts before latch 82 can be enabled to trigger the fail-safe state. Thus fail-safe is only signaled when both V+ and V− can be driven nearly all the way up to Vcc. Also, fail-safe cannot be triggered when V− is more than the offset (+50 mV) above V+. This prevents false triggering of the fail-safe state due to noise on the input lines.

During normal operation, the common-mode bias of signals V+, V− can be very high. As long as the common-mode bias is below VREF, fail-safe is not triggered. Thus the V+, V− lines can swing very close to Vcc and still not falsely trigger the fail-safe circuit. A common-mode bias of as much as 2.9 volt for a 3-volt Vcc can be tolerated. A very wide common-mode range is tolerated.

Once fail-safe is triggered, it is not easily reset by noise. Latch 82 remains in the set state despite common-mode noise that can couple into the non-driven input lines along the long cable. Latch 82 keeps the fail-safe state active during noise that can more easily be coupled into the cable when an open occurs. During normal operation, line drivers at the transmitter can over-power the noise coupled into the cable, but once a cable break of driver disconnect occurs the drivers no longer provide this noise immunity.

Noise is often common-mode, where a noise signal is coupled equally into both of the differential inputs. For example, a cable break near the transmitter allows noise to be coupled into the non-drive cable. Since both signals V+, V− are near one another, the noise coupled in should be about the same. This is especially true of twisted-pair cabling. FIG. 6 simulates this kind of common-mode noise during a cable break.

ALTERNATE EMBODIMENTS

Several other embodiments are contemplated by the inventor. For example reference voltage VREF can be lowered somewhat, such as to 95% or less of the Vcc, when a narrower common-mode range is expected. Many different resistance values can be used, and the load or terminating resistor is normally selected to match the impedance of the V+, V− transmission lines, usually in the range of 50 to 120 Ohms. The offset can be less than or more than 50 mV, such as 20 mV.

Various inversions in the logic can be introduced, and NAND gates rather than NOR gates can be substituted using DeMorgan's theorem. The inverting and non-inverting inputs to the comparators and the differential amplifier can be swapped to invert their outputs. Active-low signals rather than active-high signals can be substituted. Several gates can be combined into a larger gate, such as a 3-input AND or NAND gate. The overall output can sometimes be disabled by turning off the differential amplifier with the fail-safe signal rather than blocking its output.

Pull-down resistors rather than pull-up resistors could be attached to the differential inputs, and a reference voltage near ground could be substituted, and the comparator inputs swapped.

A flip-flop rather than a transparent latch may be substituted. A Set-Reset (SR), toggle (T), or other kind of latch or flip-flop could be substituted for the D-type with appropriate logic changes for the latch of flip-flop inputs. The clear input to latch 82 could be driven by a system or chip-wide reset OR'ed with the ND signal before being applied to latch 82. Additional latches, buffers, and gates can be added.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A fail-safe differential receiver comprising:
    a pair of differential inputs that comprise a first differential input and a second differential input;
    a differential amplifier, receiving the first and second differential inputs, for generating a difference output;
    a first comparator, receiving the first differential input and a reference voltage, for generating a first compare signal;
    a second comparator, receiving the second differential input and a reference voltage, for generating a second compare signal;
    a combining gate, receiving the first and second compare signals, for generating an enable signal; and
    a latch, triggered by the enable signal when the first and second compare signals are both active, for outputting a blocking signal;
    a blocking gate, receiving the difference output from the differential amplifier and the blocking signal, for driving a safe output to a fixed state when the latch activates the blocking signal, but for passing the difference output to the safe output when the blocking signal is not activated;
    wherein the safe output is driven to the fixed state when the latch activates the blocking signal, but the difference output from the differential amplifier is applied to the safe output when the blocking signal is not activated,
    whereby the first and second differential inputs are compared to the reference voltage to determine when to block the difference output from the differential amplifier.

2. The fail-safe differential receiver of claim 1 further comprising:
    a third comparator, receiving the first and second differential inputs, for generating a data signal to the latch;
    wherein the latch changes state in response to the data signal to activate the blocking signal when the latch is triggered by the enable signal.

3. The fail-safe differential receiver of claim 2 wherein the third comparator has an offset voltage between the first and second differential inputs;
    wherein the second differential input must be greater than the first differential input by at least the offset voltage for the data signal to indicate that the second differential input is asserted, while when the first differential input and the second differential input have a same voltage the third comparator generates the data signal to indicate that the first differential input is asserted,
    whereby the third comparator compares with an offset.

4. The fail-safe differential receiver of claim 3 wherein the offset voltage of the third comparator is substantially greater than input offsets in the first and second comparators and in the differential amplifier.

5. The fail-safe differential receiver of claim 4 wherein the offset voltage in the third comparator is at least 20 mV while offsets in the first and second comparators and in the differential amplifier are less than 5 mV.

6. The fail-safe differential receiver of claim 3 wherein the latch is a transparent D-type latch having a data input and an enable input, wherein the data input is connected to an output when the enable input is asserted but the data input is disconnected from the output when the enable input is not asserted while a previous state is driven to the output,
    whereby the transparent D-type latch is used to latch a fail-safe condition.

7. The fail-safe differential receiver of claim 6 wherein the data signal from the third comparator is applied to the data input of the latch;
    wherein the enable signal from the combining gate is applied to the enable input of the latch.

8. The fail-safe differential receiver of claim 7 wherein the latch further comprises a reset input for resetting the latch to a pre-determined state;
    wherein the data signal is also applied to the reset input.

9. The fail-safe differential receiver of claim 3 further comprising:
    a first pullup resistor, coupled between a power supply and the first differential input;
    a second pullup resistor, coupled between the power supply and the second differential input; and
    a terminating resistor, coupled between the first and second differential inputs, for generating a voltage difference that is detected by the differential amplifier.

10. A differential receiver comprising:
    a first differential input;
    a second differential input;
    differential amplifier means, responsive to the first and second differential inputs, for generating a difference signal in response to a voltage difference between the first and second differential inputs;
    first compare means, coupled to the first differential input, for determining when the first differential input is outside of a voltage limit;

second compare means, coupled to the second differential input, for determining when the second differential input is outside of the voltage limit;

offset compare means, coupled to the first and second differential inputs, for comparing voltages of the first and second differential inputs to generate and activate a data signal when the first differential input is greater or equal in voltage to the second differential input;

latching means, receiving the data signal from the offset compare means, for latching the data signal when the first and second compare means determine that the first and second differential inputs are both outside the voltage limit;

blocking means, coupled to the latching means, for blocking the difference signal from the differential amplifier means when both the first differential input and the second differential input are outside of the voltage limit and the data signal is activated and latched;

whereby the difference signal from the differential amplifier means is blocked when both the first differential input and the second differential input are outside of the voltage limit and the data signal is activated and latched.

11. The differential receiver of claim 10 wherein the latching means outputs a blocking signal that indicates when the difference signal is to be blocked.

12. The differential receiver of claim 11 further comprising:

combining means, coupled to the first and second compare means, for generating a clock signal that is activated when both the first differential input and the second differential input are outside of the voltage limit.

13. The differential receiver of claim 12 wherein the latching means receives the clock signal from the combining means and clocks the data signal from the offset compare means to the blocking signal when clock signal is activated.

14. The differential receiver of claim 13 wherein the latching means includes reset means for disabling the blocking signal when the data signal being not activated;

wherein the latching means clocks the data signal to the blocking signal when both the clock signal is activated and the data signal are activated.

15. The differential receiver of claim 13 wherein the latching means comprises a D-type transparent latch or a D-type flip-flop.

16. A differential receiver with open-cable detection comprising:

a cable input having a first differential line and a second differential line;

a load resistor coupled between the first and second differential lines to generate a voltage difference;

a differential amplifier for amplifying the voltage difference across the load resistor, the differential amplifier receiving the first and second differential lines and generating a difference output;

a first comparator, receiving the first differential line and coupled to a reference node, for comparing a voltage on the first differential line to a reference voltage on the reference node and generating a first compare output;

a second comparator, receiving the second differential line and coupled to the reference node, for comparing a voltage on the second differential line to the reference voltage on the reference node and generating a second compare output;

a third comparator, receiving the first and second differential lines, for comparing a voltage on the first differential line to an offset of a voltage on the second differential line and generating a third compare output;

a storage element, having a state that drives a blocking signal, the state being set when the first compare output, the second compare output, and the third compare output indicate that the first and second differential lines are both above the reference voltage and the first differential line is greater or equal to the second differential line;

blocking logic, receiving the blocking signal, for blocking the difference output and driving a final output with a constant signal when the state in the storage element is set, but otherwise passing the difference output to the final output.

17. The differential receiver with open-able detection of claim 16 wherein the storage element is a latch or a flip-flop that is clocked by a combination of the first and second compare outputs and is set by the third compare output when clocked.

18. The differential receiver with open-cable detection of claim 16 further comprising:

a first resistor coupled to the first differential line, for driving the first differential line to a fixed voltage when the first differential line is open;

a second resistor coupled to the second differential line, for driving the second differential line to a fixed voltage when the second differential line is open.

19. The differential receiver with open-able detection of claim 18 wherein the fixed voltage is a power-supply voltage, and wherein the voltage reference is within 10% of the power-supply voltage.

* * * * *